United States Patent
Maeda et al.

(10) Patent No.: US 7,393,417 B1
(45) Date of Patent: Jul. 1, 2008

(54) SEMICONDUCTOR-MANUFACTURING APPARATUS

(75) Inventors: Yuji Maeda, Nanta (JP); Koji Nakanishi, Nanta (JP); Nobuo Tokai, Nanta (JP); Ichiro Kawai, Nanta (JP)

(73) Assignee: Applied Materials, Inc., Santa Clara, CA (US)

( * ) Notice: Subject to any disclaimer, the term of this patent is extended or adjusted under 35 U.S.C. 154(b) by 1074 days.

(21) Appl. No.: 10/111,555

(22) PCT Filed: Oct. 20, 2000

(86) PCT No.: PCT/JP00/07340

§ 371 (c)(1),
(2), (4) Date: Apr. 25, 2002

(87) PCT Pub. No.: WO01/33617

PCT Pub. Date: May 10, 2001

(30) Foreign Application Priority Data

Oct. 29, 1999 (JP) .................................. 11-309549

(51) Int. Cl.
*H01L 21/00* (2006.01)
*C23C 14/00* (2006.01)
*C23C 16/00* (2006.01)

(52) U.S. Cl. ..................... 118/725; 118/728; 118/730; 156/345.51; 156/345.52; 156/345.55; 219/444.1

(58) Field of Classification Search ................. 118/724; 156/345.52; 219/444.1
See application file for complete search history.

(56) References Cited

U.S. PATENT DOCUMENTS

| | | | | |
|---|---|---|---|---|
| 5,242,501 | A | * | 9/1993 | McDiarmid ................. 118/728 |
| 5,493,987 | A | | 2/1996 | McDiarmid et al. ......... 117/102 |
| 5,527,393 | A | | 6/1996 | Sato et al. ................... 118/725 |
| 5,645,646 | A | * | 7/1997 | Beinglass et al. ........... 118/730 |
| 5,800,622 | A | | 9/1998 | Takemi et al. ............... 118/725 |

FOREIGN PATENT DOCUMENTS

| | | |
|---|---|---|
| EP | 0 766 289 A2 | 4/1997 |
| JP | 61-215289 | 9/1986 |
| JP | 7-058040 | 3/1995 |
| JP | 9-125251 | 5/1997 |

OTHER PUBLICATIONS

EP Communication dated Oct. 29, 2002.
EP Examination Report for EP 969 956.2-2119, dated Mar. 31, 2003.
* cited by examiner

*Primary Examiner*—Ram N. Kackar
(74) *Attorney, Agent, or Firm*—Patterson & Sheridan, L.L.P.

(57) ABSTRACT

On a wafer holding area 50 on the upper surface of a susceptor 22, a wafer W is supported by a wafer support 54 such that a gap with a predetermined distance is formed between the wafer W and a wafer heating surface 52. A projection 58 that decreases the distance of the gap with respect to the wafer W is formed on the wafer heating surface 52. At this time, the heating condition for the wafer W by the susceptor 22 is adjusted by means of the distances of the gaps at the respective portions of the wafer holding area 50. Thus, the uniformity of the planar temperature distribution of the wafer W and that of the thickness distribution of the formed film can be improved.

6 Claims, 6 Drawing Sheets

SEMICONDUCTOR-MANUFACTURING APPARATUS

TECHNICAL FIELD

The present invention relates to a semiconductor manufacturing apparatus with a susceptor for holding and heating a semiconductor wafer (substrate).

BACKGROUND ART

Semiconductor manufacturing apparatuses include one called a single wafer processing type semiconductor manufacturing apparatus for processing silicon wafers one by one. In this single wafer processing type semiconductor manufacturing apparatus, a wafer support unit for horizontally supporting only one wafer is usually arranged in a process chamber.

The wafer support unit generally has a susceptor (substrate holding table) where a wafer is placed. The susceptor is heated by a heating means such as a lamp, and the wafer is heated through the susceptor.

The wafer support unit also has a lift mechanism for vertically moving the wafer placed on the susceptor with respect to the susceptor. The lift mechanism has a plurality of lift pins extending through the susceptor. When the wafer is placed on the upper ends of the lift pins and the lift pins are vertically moved, the wafer can be vertically moved. The lift mechanism can transfer a wafer transferred on the blade of a transfer robot onto the susceptor, or can conversely transfer a wafer from the susceptor to the transfer robot.

DISCLOSURE OF INVENTION

In the wafer support unit described above, in order to obtain uniformity of the planar temperature distribution of a wafer placed on the susceptor, the planar temperature of the susceptor serving as the holding table and used for heating the wafer must be uniformed. As a method of adjusting the temperature distribution, a method of obtaining temperature uniformity by adjusting the heating condition for the susceptor is available, e.g., by adjusting the irradiating condition of the heating light from a lamp in the case of lamp heating.

With the method of adjusting the heating condition for the susceptor in accordance with the light irradiating condition and the like, however, when a sufficiently high planar temperature uniformity of the wafer is to be obtained, the heating adjusting method becomes complicated. Alternatively, due to limitations such as the arrangement and positional relationship of the heating means, a sufficiently high temperature uniformity cannot be obtained.

A nonuniform planar temperature distribution occurs in the wafer due to various factors. For example, the condition of heat conduction from the susceptor to the wafer sometimes differs between the center and periphery of the susceptor. It is difficult to obtain temperature uniformity by adjusting all the heating conditions for the wafer in accordance with the heating condition for the susceptor. When the planar temperature becomes nonuniform in the wafer, the film deposition condition becomes nonuniform within the wafer surface. Accordingly, nonuniformity occurs in the distribution of the thickness of the formed film.

The present invention has been made in view of the above problems, and has as its object to provide a semiconductor manufacturing apparatus using a susceptor that improves the uniformity of the planar temperature distribution of a semiconductor wafer (substrate) as a processing target.

To achieve the above object, the present inventors have conducted intensive studies. Consequently, the present inventors have found that when a three-dimensional structure is added to the planar shape of the upper surface of the susceptor in the wafer holding area, the planar temperature distribution of the wafer is adjusted, and the temperature distribution is uniformed, so that the uniformity of the thickness distribution of the formed film can be improved, thus reaching the present invention.

More specifically, a semiconductor manufacturing apparatus according to the present invention is a semiconductor manufacturing apparatus comprising a process chamber, a susceptor set in the process chamber to hold a target substrate in a substrate holding area on an upper surface thereof and heat the target substrate, and heating means for heating the target substrate through the susceptor, characterized in that the susceptor supports the target substrate with a substrate support member so as to form, in the substrate holding area, a gap with a first distance between a substrate heating surface as that surface portion of the upper surface of the susceptor which opposes the target substrate and a lower surface of the target substrate, and a heating adjusting portion for forming a gap with a second distance different from the first distance is formed at a predetermined portion on the substrate heating surface.

According to the semiconductor manufacturing apparatus described above, in the susceptor for holding a substrate (target substrate) as a processing target such as a semiconductor wafer or glass substrate, the substrate is held by forming a gap between the target substrate and the substrate heating surface. This decreases influences on the temperature distribution of the substrate such as the local three-dimensional structure on the substrate heating surface and the nonuniformity of the temperature distribution.

Furthermore, regarding nonuniformities of the temperature and film thickness distributions caused by various types of factors such as a difference in heat conduction condition between the center and periphery of the susceptor, in the susceptor described above, a recessed or projecting heating adjusting portion with a different gap distance is formed in the substrate heating surface, so that the distance of the gap between the target substrate and substrate heating surface is positively imparted with a distribution. Thus, the heating conditions for the target substrate at the respective portions of the substrate heating surface are set and adjusted, so that the planar temperature distribution of the substrate such as a wafer can be uniformed so as to obtain a uniform formed film thickness distribution.

BEST MODE OF CARRYING OUT THE INVENTION

Figure 1:
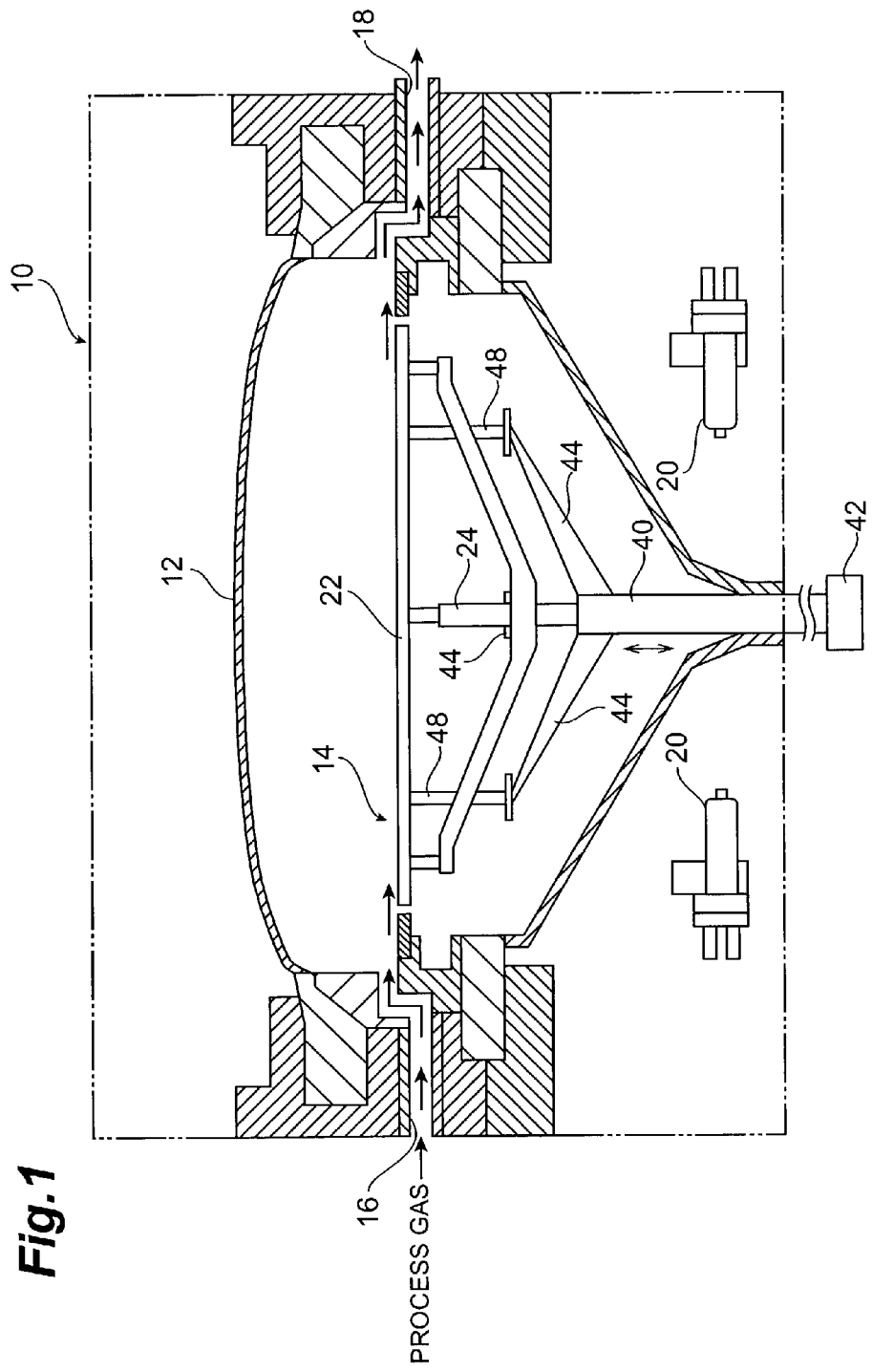
FIG. 1 is a view schematically showing a film deposition apparatus as an embodiment of a semiconductor manufacturing apparatus.

A preferred embodiment of a semiconductor manufacturing apparatus according to the present invention will be described in detail with reference to the accompanying drawings. In the description of the drawings, the same elements are denoted by the same reference numerals, and a repetitive explanation thereof is omitted. The dimensional proportion of the drawings does not necessarily correspond to that of the described embodiment.

FIG. 1 schematically shows a film deposition apparatus such as an epitaxial growth apparatus as a semiconductor manufacturing apparatus according to the present invention. A film deposition apparatus 10 shown in FIG. 1 is a single wafer processing type apparatus for processing silicon wafers (not shown in FIG. 1) as target substrates one by one. An example of the target substrate includes a semiconductor wafer and glass substrate. A case wherein the target substrate is a silicon wafer will be described hereinafter.

The film deposition apparatus 10 has a process chamber 12 made of silica glass, and a wafer support unit 14 is set in the process chamber 12. A process gas inlet port 16 is formed in the side portion of the process chamber 12, and an exhaust port 18 is formed in the process chamber 12 at a position opposing it. A plurality of, e.g., 20, halogen lamps 20 serving as a heating means are radially arranged in the lower region of the process chamber 12.

In the film deposition apparatus 10 with the above arrangement, a wafer is supported by the wafer support unit 14. After that, the halogen lamps 20 are turned on to heat the wafer, and a process gas is introduced from the inlet port 16 while performing evacuation from the exhaust port 18. Then, the process gas flows in the form of a laminar flow along the surface of the wafer heated to a predetermined temperature, and silicon single crystals epitaxially grow on the wafer. As the process gas to be supplied, for example, one obtained by mixing a silicon source gas such as $SiH_4$, $Si_2H_6$, or $SiH_2Cl_2$, a dopant gas such as $PH_3$, $AsH_3$, or $B_2H_6$, and a carrier gas such as $H_2$ or $N_2$ in a gas panel (not shown) is used. The pressure in the process chamber 12 is adjusted to 0.7 kPa (5 Torr) to 88 kPa (660 Torr) by means of the aperture ratio of the throttle valve in the exhaust pipe.

The wafer support unit 14 applied to the film deposition apparatus 10 shown in FIG. 1 has a susceptor 22 as a holding table for holding the wafer. The susceptor 22 is a disk-like one made of a graphite material and covered with silicon carbide, and is horizontally supported by a support shaft 24, made of quartz glass and standing upright in the lower portion of the process chamber 12, at three points from its lower surface. The susceptor 22 is used for holding and heating the wafer.

Figure 2A:
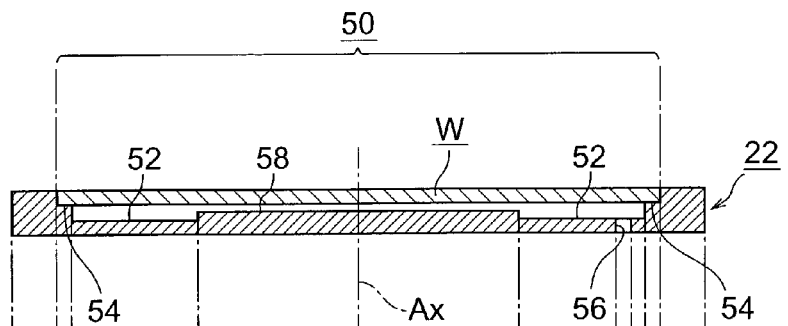
FIGS. 2A and 2B are side sectional and upper plan views, respectively, showing the arrangement of a susceptor used in the film deposition apparatus shown in FIG. 1.
Figure 2B:
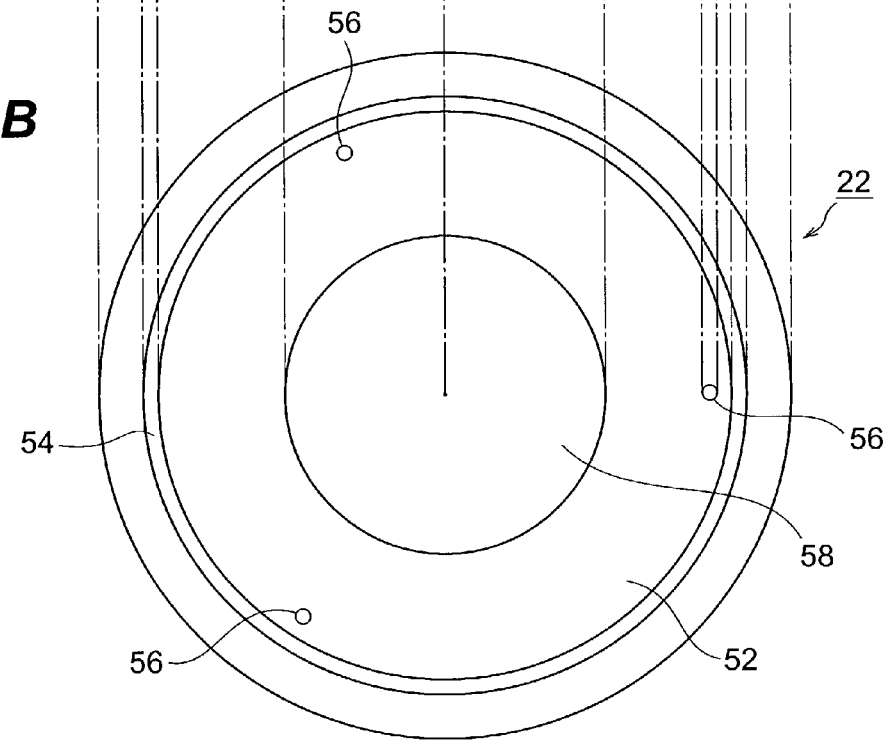
Figure 3:
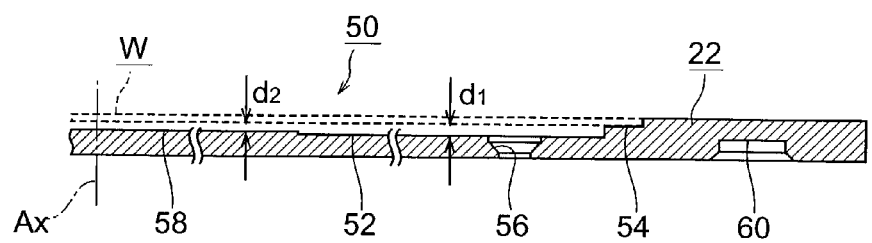
FIG. 3 is a partly enlarged side sectional view of the susceptor shown in FIG. 2A.

FIGS. 2A and 2B are side sectional and upper plan views, respectively, showing the arrangement of the susceptor 22. FIG. 3 is a partly enlarged side sectional view showing the right portion of the susceptor 22 shown in FIG. 2A. Regarding a wafer W supported by the susceptor 22, FIG. 2A shows the wafer W in a supported state, FIG. 3 shows, with a dashed line, a position where the wafer W is supported, and FIG. 2B shows the structure of the susceptor 22 that does not support the wafer W.

A substantially circular wafer holding area (substrate holding area) 50 for accommodating and holding the wafer W is set on the upper surface of the susceptor 22 about a central axis Ax of the disk-like susceptor 22 as the center. A wafer heating surface (substrate heating surface) 52 formed of a circular recess about the central axis Ax as the center is formed in the wafer holding area 50. A susceptor support 60 for supporting the susceptor 22 with the support shaft 24 is formed in that lower surface of the susceptor 22 which is outside the wafer holding area 50.

An annular projecting step is formed on the periphery of the wafer heating surface 52 along the outer circumference of the wafer heating surface 52. This annular step is a wafer support (substrate support) 54 for supporting the wafer W. When the wafer W is arranged at a predetermined position in the wafer holding area 50 of the susceptor 22, it is supported on the upper surface of the wafer support 54 formed on the periphery of the wafer heating surface 52 such that the lower portion of the outer edge of the wafer W is in contact with the upper surface of the wafer support 54 (see FIGS. 2A and 3). In this support state, the upper surface of the wafer W and the upper surface of that peripheral portion of the susceptor 22 which is outside the wafer holding area 50 become almost level. This aims at allowing the process gas introduced from the inlet port 16 to flow while it is maintained in the laminar flow state.

Lift pin through holes 56, through which extend lift pins 48 (see FIG. 1) for vertically moving the wafer W with respect to the susceptor 22, are formed at predetermined positions in the wafer heating surface 52. According to this embodiment, three lift pin through holes 56 are formed, as shown in FIG. 2B.

The susceptor 22 according to this embodiment has a projection 58, which serves as a heating adjusting portion, in the wafer heating surface 52. The projection 58 projects from the wafer heating surface 52 to form the shape of a circular island about the central axis Ax as the center. The projecting height of the projection 58 from the wafer heating surface 52 is set to be smaller than the height from the wafer heating surface 52 to the upper surface of the wafer support 54.

During heating and film deposition of the wafer W. the wafer W is held on the rotating susceptor 22, and is heated to 500° C. to 700° C. by heat conduction, convection, and radiation from the susceptor 22 heated by the halogen lamps 20 arranged under the susceptor 22. The central axis Ax of the susceptor 22 coincides with the central axis of rotation of the susceptor 22 which is rotatably driven.

How to vertically move the lift pins 48 and to transfer and support the wafer W will be described. The lift pins 48 are vertically moved by the lift mechanism of the film deposition apparatus 10. As shown in FIG. 1, the lift mechanism has a vertically movable lift tube 40 arranged to surround the main shaft of the susceptor support shaft 24, a driving unit 42 for vertically moving the lift tube 40, three lift arms 44 extending radially from the lift tube 40, and the lift pins 48 extending through the susceptor 22 by means of the lift pin through holes 56 and vertically moved by the lift arms 44. When the driving unit 42 is controlled to move the lift tube 40 and lift arms 44 upward, the lift pins 48 are pushed up by the distal ends of the lift arms 44.

When the wafer W is to be supported by the wafer support unit 14 with this arrangement, first, a transfer robot (not shown) is operated to set the wafer W placed on the blade of the transfer robot at a position immediately above the wafer holding area 50 of the susceptor 22. Subsequently, the driving unit 42 of the lift mechanism is controlled to move the lift pins 48 upward. The blade of the transfer robot has such a shape and arrangement that do not interfere with upward movement of the lift pins 48. When the lift pins 48 are moved upward to a position higher than the blade, the wafer W is transferred from the blade to the lift pins 48, and is supported by the lift pins 48 at the three points.

When the wafer W is supported by the lift pins 48, the blade of the transfer robot is moved from above the susceptor 22 to the outside of the process chamber 12, and the lift pins 48 are moved downward. When the lift pins 48 are moved downward to be completely housed in the lift pin through holes 56, their upper surfaces are located below the wafer heating surface 52, and the wafer W comes into contact with the upper surface of the wafer support 54 of the susceptor 22 and is supported by it. After this, a film deposition process such as epitaxial growth described above is performed.

It will be easily understood that when the wafer W is to be lifted up from the susceptor 22 and transferred to the blade of the transfer robot, the lift mechanism and transfer robot may be operated in the opposite procedure to that described above.

The effect of the susceptor 22 according to the embodiment described above will be described together with a practical example. In the examples and their data to be described hereinafter, the diameter of the wafer holding area 50 is 202.5 mm (7.972 inches), that of the wafer heating surface 52 is 195.0 mm (7.677 inches), and that of the projection 58 is 101.6 mm (4.000 inches).

In the susceptor 22 shown in FIGS. 2A, 2B, and 3, the wafer W is supported within the wafer holding area 50 by the wafer support 54 formed stepwise on the periphery of the wafer heating surface 52. At this time, the wafer W is supported by the contact portion with the wafer support 54 such that a gap with a first distance $d_1$ is formed with respect to the wafer heating surface 52 (see FIG. 3).

When the heating method using the susceptor 22 is employed to heat the wafer W, within a high pressure region where heat conduction and convection are dominant in the wafer heating mechanism, a difference in heat conduction between the center and periphery of the susceptor 22, the three-dimensional planar shape of the susceptor 22 within the wafer holding area 50, and the like largely influence the planar temperature distribution of the wafer W. Therefore, nonuniformity occurs in the planar temperature distribution of the wafer W. When the temperature distribution of the wafer W becomes nonuniform, the film deposition conditions become nonuniform at the respective portions within the surface of the wafer W. As a result, nonuniformity occurs in the distribution of the thickness of the formed film.

In view of this problem, the temperature distribution of the wafer W may be adjusted by adjusting the heating condition of the susceptor 22, e.g., the heating condition with the halogen lamps 20 in FIG. 1. With this method, however, heating control becomes complicated, or the arrangement of the halogen lamps 20 poses limitation, so a sufficiently high temperature uniformity cannot be obtained.

When the pressure during film deposition is decreased, contribution of heat conduction and convection in heating is decreased to improve the temperature uniformity. With this method, however, in a process such as polysilicon film deposition where the film deposition rate is substantially proportional to the pressure (film deposition pressure) in the process chamber 12 during film deposition, the film deposition ability undesirably decreases largely.

In contrast to this, with the susceptor 22 according to this embodiment, the wafer W is supported by the step-like wafer support 54 such that the gap with the distance $d_1$ is formed between the wafer W and the wafer heating surface 52. Also, by utilizing this gap, a predetermined change (distribution) is imparted to the gap distance at the respective portions of the wafer heating surface 52. Hence, the planar temperature distribution of the wafer W is adjusted.

In order to adjust the temperature distribution, the wafer heating surface 52 of the susceptor 22 has, as a heating adjusting portion for adjusting the heating condition for the wafer W, the projection 58 with a projecting height from the wafer heating surface 52 which is smaller than the height from the wafer heating surface 52 to the upper surface of the wafer support 54. At this time, the wafer W and the upper surface of the projection 58 form a gap with a second distance $d_2$ that satisfies $d_1 > d_2 > 0$. In this manner, the projection 58 that forms the gap with a distance different from the distance $d_1$ between the wafer W and another portion of the wafer heating surface 52 is formed in the wafer heating surface 52, so that adjustment of the temperature distribution is realized.

More specifically, in addition to the adjustment of the temperature distribution of the susceptor 22, the gap distance distribution by means of the gap between the wafer W and wafer heating surface 52 and the three-dimensional structure of the heating adjusting portion such as the projection 58 sets and adjusts the heating condition from the susceptor 22 to the wafer W at the respective portions in the wafer holding area 50, thereby realizing adjustment of the planar temperature distribution of the wafer W. As a result, the uniformity of the temperature distribution and that of the thickness of the formed film can be improved without decreasing the film deposition efficiency.

This temperature distribution adjusting method can be performed easily when compared to the adjustment of the heating condition by means of the halogen lamps 20. Also, the necessary manufacturing precision for the heating mechanism such as the halogen lamps 20 is moderated. Thus, the manufacturing cost of the semiconductor manufacturing apparatus such as the film deposition apparatus 10 can be reduced.

Figure 4A:
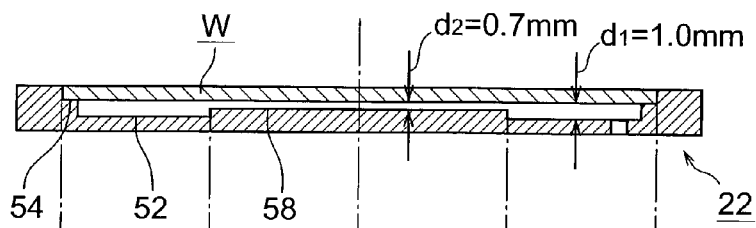
FIG. 4A is a side sectional view of the susceptor shown in FIG. 2A.
Figure 4B:
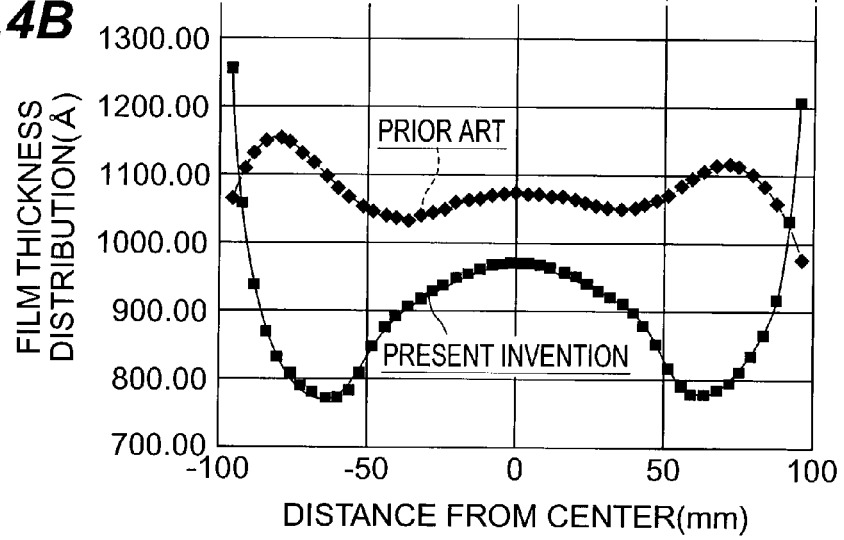
FIG. 4B is a graph for comparing film thickness distribution obtained by film deposition using the susceptor with a case wherein a conventional susceptor is used.

FIG. 4A is a side sectional view of the susceptor 22 of the above embodiment shown in FIG. 2A, and FIG. 4B is a graph for comparing film thickness distribution obtained by film deposition using the susceptor 22 with a case wherein a conventional susceptor is used. In the graph of FIG. 4B, the axis of abscissa represents the distance (mm) from the center, and the axis of ordinate represents the film thickness (Å) at respective positions. Note that the distance of the gap between the wafer W and wafer heating surface 52 and that of the gap between the wafer W and projection 58 are $d_1$=1.0 mm and $d_2$=0.7 mm, respectively. The conventional susceptor corresponds to a case wherein $d_1$=$d_2$=0 mm is established in the susceptor 22. The film deposition pressure is 16 kPa (120 Torr). The film deposition temperature is 616° C. in the conventional case and is 620° C. in the example of the present invention.

From the film thickness distribution data of the prior art shown in FIG. 4B, a film thickness distribution with a large film thickness in the vicinity of the periphery of the wafer and a slightly small film thickness on the inner side of the wafer is obtained due to the difference in heat conduction between the center and periphery of the susceptor, the heating condition of the halogen lamps, and the like. More specifically, the inner side of the wafer is not sufficiently heated by the susceptor. Consequently, the thickness of the formed film slightly decreases on the inner side.

In contrast to this, from the film thickness distribution data obtained by using the film deposition apparatus 10 according to this embodiment, the thickness of the formed film becomes slightly small as a whole because of the gap between the wafer W and wafer heating surface 52. Regarding the inner side where the thickness of the formed film is small because of insufficient heating, the projection 58 is formed on the wafer heating surface 52 to increase the heating efficiency for the wafer W, thereby adjusting the temperature distribution of the wafer W. This temperature distribution adjustment changes the film deposition condition. As a result, a film thickness distribution in which the film thickness is large on the inner side when compared to that on the periphery of the wafer W is obtained.

In this manner, with the film deposition apparatus with the susceptor 22 according to the above embodiment, the planar temperature distribution of the wafer W and the obtained film thickness distribution can be adjusted by setting the gap between the wafer W and wafer heating surface 52 and the gap distance distribution at respective portions.

The example shown in FIGS. 4A and 4B shows the effect of the adjustment of the temperature distribution and film thickness distribution performed by forming a heating adjusting portion such as the projection 58 on the wafer heating surface 52, as described above. Therefore, even regarding the film thickness distribution obtained by this example, a nonuniformity still exists in the entire film thickness distribution. The nonuniformity in film thickness distribution is solved by further changing the planar shape of the wafer heating surface 52 to correspond to the obtained film thickness distribution, so that the entire planar temperature and film thickness can be finally uniformed in the wafer W.

Figure 5:
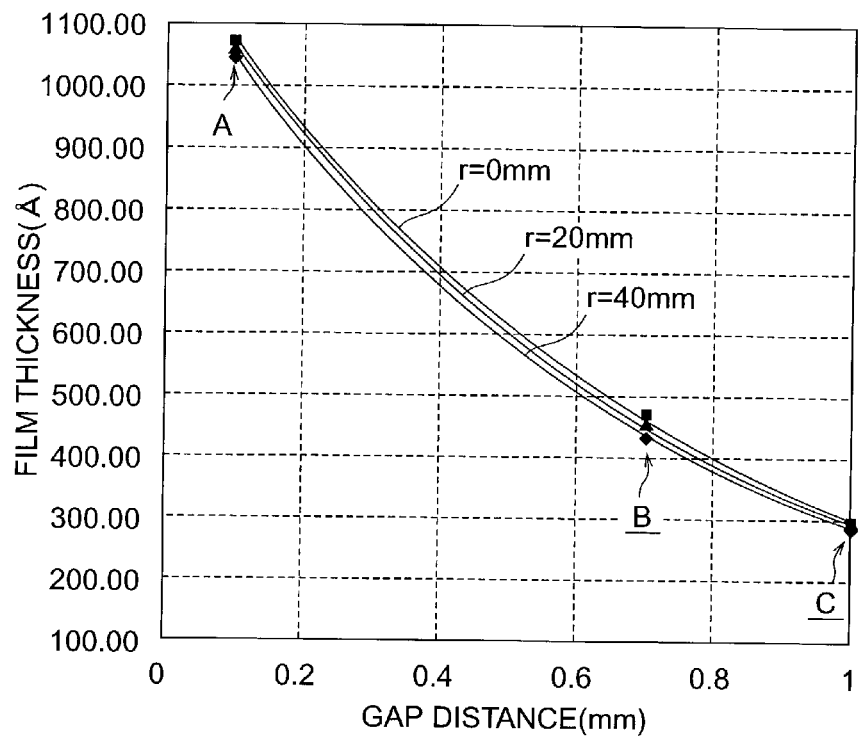
FIG. 5 is a graph showing a change in film thickness with respect to the distance of the gap between a wafer and susceptor.

FIG. 5 is a graph showing a change in thickness (Å) of the formed film with respect to a distance d (mm) of the gap between the wafer W and susceptor 22. In this data, film deposition is performed with the film deposition conditions including a film deposition temperature of 620° C., a film deposition pressure of 16 kPa (120 Torr), and a film deposition time of 59 seconds. The flow rate of the process gas used for film deposition is 0.9 l/min (slm, standard l/min) for $SiH_4$ gas and 8.9 l/min (slm, standard l/min) for $H_2$ gas.

FIG. 5 shows a change in film thickness at three positions, i.e., the position of rotational center (r=0 mm) within the wafer holding area 50, a position at 20 mm from the central position (r=20 mm), and a position at 40 mm from the central position (r=40 mm). Regarding respective data point groups A, B, and C, the data point group A shows a film thickness obtained when it is assumed that a gap of about 0.1 mm is formed in the conventional flat susceptor, the data point group B shows a film thickness at a gap of the projection 58 which corresponds to $d_2$=0.7 mm, and the data point group C shows a film thickness at a gap of the wafer heating surface 52 which corresponds to $d_1$=1.0 mm. The lines connecting the respective data points are curves formed under the assumption that the film thickness changes exponentially with respect to the distance.

As is apparent from these graphs, the thickness of the formed film smoothly changes (e.g., exponentially) as the distance d of the gap changes. Therefore, from the film thickness distribution shown in FIG. 4B and obtained by using the susceptor 22, when the planar shape of the susceptor 22 is corrected by referring to the film thickness change data shown in FIG. 5, the thicknesses at the respective positions of the film formed can be further adjusted, so that the obtained film thickness distribution can be uniformed.

It is apparent from the three graphs of FIG. 5 that the film thicknesses changes almost equally with respect to the distance d regardless of the distance from the center position. Therefore, for the respective portions in the wafer holding area 50, the same gap distance setting method may be applied, thereby determining the planar shape of the wafer heating surface 52.

According to an example of a general planar shape determining method, a distance as a reference of the gap between the wafer and the wafer heating surface may be determined, and the wafer heating surface as a reference surface may be set. A heating adjusting portion with a three-dimensional structure corresponding to a film thickness distribution to be adjusted may be imparted to the reference surface, so that the shape of the wafer heating surface to be finally used may be determined.

Usually, the nonuniformity of the temperature distribution and that of the film thickness distribution often occur substantially point symmetrically with respect to the center position of the wafer heating surface. In this case, the heating adjusting portion is preferably set to be island-like or annularly which is point symmetrical (concentric) with respect to the center position of the wafer heating surface as the center. If a nonuniform portion which is not point symmetrical is present, like a local nonuniformity, then a heating adjusting portion by means of a local three-dimensional structure corresponding to it may be formed.

In the case of the conventional substantially flat susceptor, a local temperature distribution nonuniformity may be caused by a recess of the lift pin through holes 56, and a change may be caused in the film thickness distribution due to the local temperature distribution nonuniformity. Regarding this, when a gap is formed between the wafer W and wafer heating surface 52, as in this embodiment, the local change in film thickness can be decreased simultaneously. Decrease in local film thickness nonuniformity can also be realized in the same manner by the gap described above, even when it is caused by other than the lift pin through holes 56.

Figure 6:
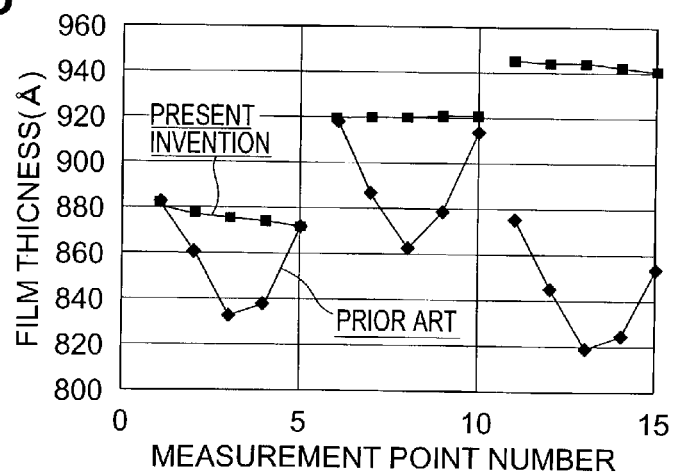
FIG. 6 is a graph for comparing the film thickness distribution in the vicinities of lift pin through holes, obtained by film deposition using the susceptor shown in FIGS. 2A and 2B, with a case wherein the conventional susceptor is used.
Figure 7:
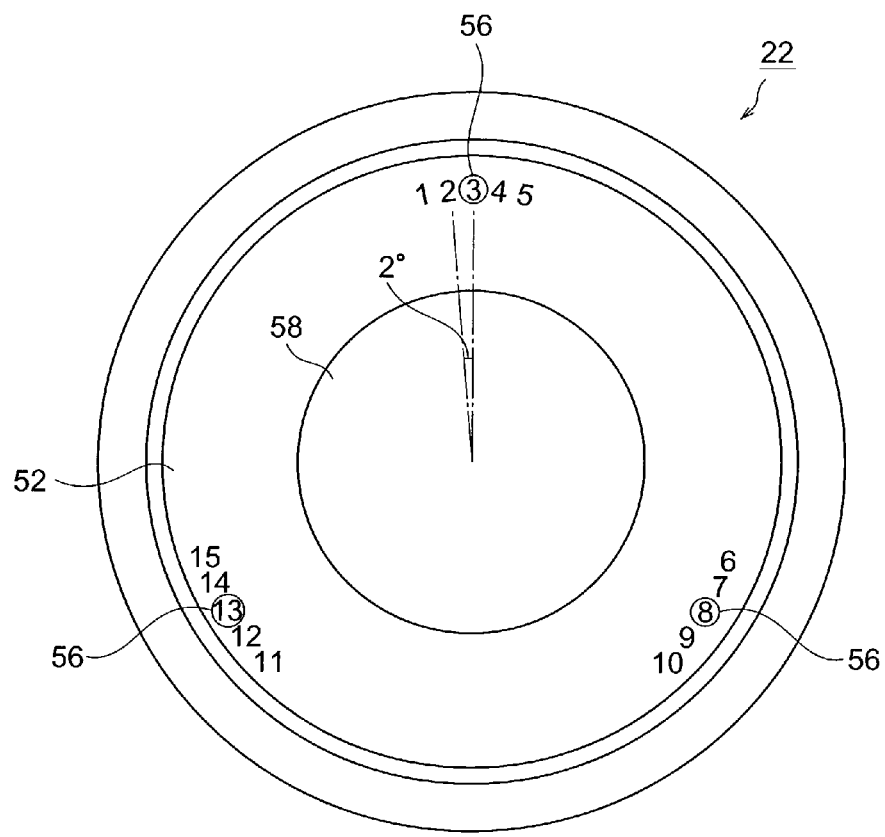
FIG. 7 is an upper plan view showing measurement points used for film thickness measurement shown in FIG. 6.

FIG. 6 is a graph for comparing the film thickness distribution in the vicinities of the lift pin through holes 56, obtained by film deposition using the susceptor 22, with a case wherein a conventional substantially flat susceptor is used. In the graph, the axis of abscissa represents the film thickness measurement point numbers, and the axis of ordinate represents the measured film thickness (Å). The respective film thickness measurement points are as shown in FIG. 7. Namely, regarding the three lift pin through holes 56 of the susceptor 22, measurement points are arranged at a total of 15 portions, i.e., five measurement points 1 to 5 in the vicinity of the position of the first lift pin through hole 56 with respect to it as the measurement point 3, five measurement points 6 to 10 in the vicinity of the position of the second lift pin through hole 56 with respect to it as the measurement point 8, and five measurement points 11 to 15 in the vicinity of the position of the third lift pin through hole 56 with respect to it as the measurement point 13, are arranged clockwise on a circumference passing through the three lift pin through holes 56. The distance between any adjacent measurement points in the vicinity of each lift pin through hole 56 is 2° in the angle from the center of the susceptor 22.

In the vicinities of the lift pin through holes 56, in film deposition using the conventional susceptor, a local film thickness decrease occurs, as shown in FIG. 6. In contrast to this, in film deposition using the susceptor 22 with the gap being formed between the wafer W and wafer heating surface 52, the film thickness is substantially constant in the vicinity of any lift pin through hole 56, and no local change occurs in film thickness. In this manner, a local change in film thickness caused by the lift pin through holes 56 can be decreased simultaneously by means of the arrangement of the susceptor 22 described above.

The gap distance $d_1$ between the wafer W and wafer heating surface 52 is preferably 1 mm or less. If the gap distance is excessively large, the heating efficiency for the wafer W decreases. If the gap distance $d_1$ is 1 mm or less, excessive decrease in heating efficiency can be prevented. Meanwhile, to suppress a local film thickness change, a certain degree of gap distance is needed. Therefore, a suitable gap distance, e.g., 1 mm, is preferably selected in the above distance range from the conditions for the film thickness.

As such a susceptor, for example, the following one is available. In this susceptor, the maximum distance from the lower surface of the wafer is set on the basis of a necessary heating efficiency, and a surface with the maximum distance as the gap distance is set. A projection projecting toward the wafer is formed on that portion of this surface where heating is insufficient, thereby forming a wafer heating surface. This can realize adjustment of the heating distribution while maintaining a sufficiently high heating efficiency over the entire portion in the wafer holding area 50. Depending on the heating condition at the respective portions, a recess may be formed in part of the wafer holding area 50.

The semiconductor manufacturing apparatus according to the present invention is not limited to the embodiment described above, but can be modified in various manners. For example, although the semiconductor manufacturing apparatus according to the above embodiment is a film deposition apparatus such as an epitaxial growth apparatus, the present invention can also be applied to other apparatuses for performing other processes, e.g., a CVD apparatus. Regarding the planar shape within the wafer holding area 50, the three-dimensional structure of the heating adjusting portion may be naturally modified in various manners to match the individual apparatus. The wafer support is not also limited to an annular one, as in the above embodiment, which is formed on the entire periphery, but can be stepped or projecting wafer supports formed at a plurality of positions of part of the periphery. A substrate support member other than this may also be used.

Regarding the heating means for heating the susceptor, one other than a heating lamp group located below the susceptor may be used.

INDUSTRIAL APPLICABILITY

In the semiconductor manufacturing apparatus according to the present invention, the susceptor is formed to form a gap with a predetermined distance between a wafer and a wafer heating surface. A heating adjusting portion with a three-dimensional structure is formed on the wafer heating surface to impart a nonconstant distribution to the gap distance. This apparatus can be utilized as a semiconductor manufacturing apparatus that can adjust the planar temperature distribution of the wafer and the distribution of the thickness of the formed film by setting the heating conditions such as the heating efficiency distribution of the susceptor for the respective portions of the wafer.

At this time, when compared to a case wherein temperature distribution is adjusted by means of the heating condition for the susceptor with the lamps, temperature distribution adjustment can be realized more easily and at a lower cost. In particular, in temperature distribution adjustment with the above susceptor structure, the degree of freedom for adjustment is large and various shape design is possible. As a result, the temperature distribution uniformity can be sufficiently improved. Since the film deposition pressure need not be decreased, a high film deposition efficiency can be obtained.

The invention claimed is:

1. A semiconductor manufacturing apparatus comprising a process chamber, a susceptor set in said process chamber to hold a target substrate in a substrate holding area on an upper surface thereof and heat the target substrate, and heating means for heating the target substrate through said susceptor, wherein said susceptor supports the target substrate with a substrate support member so as to form, in the substrate holding area, a gap with a first distance between a substrate heating surface as that surface portion of the upper surface of said susceptor which opposes the target substrate and a lower surface of the target substrate, and a heating adjusting portion for forming a gap with a second distance smaller than the first distance is formed at a predetermined portion on the substrate heating surface, wherein the heating adjusting portion is island-like and formed about and includes a position of rotational center on the substrate heating surface when said susceptor is rotatably driven.

2. A semiconductor manufacturing apparatus according to claim 1, wherein distances of gaps formed at respective portions of the substrate heating surface with respect to the lower surface of the target substrate are not more than the first distance, and the heating adjusting portion is a projection projecting from the substrate heating surface toward the target substrate.

3. A semiconductor manufacturing apparatus according to claim 2, wherein the first distance is not more than 1 mm.

4. A semiconductor manufacturing apparatus according to claim 1, wherein the substrate support member is a substrate support which is formed on the upper surface of said susceptor along a periphery of the substrate heating surface, and which supports the target substrate when a lower portion of an outer edge of the target substrate comes into contact with an upper surface of the substrate support member.

5. A semiconductor manufacturing apparatus according to claim 4, wherein the substrate support is formed annularly in an entire periphery of the substrate heating surface.

6. A semiconductor manufacturing apparatus according to claim 1, wherein said heating means comprises a plurality of heating lamps arranged to oppose a lower surface of said susceptor.

* * * * *